(12) United States Patent
Frisina

(10) Patent No.: US 6,391,723 B1
(45) Date of Patent: May 21, 2002

(54) FABRICATION OF VDMOS STRUCTURE WITH REDUCED PARASITIC EFFECTS

(75) Inventor: Ferruccio Frisina, Sant'Agata Li Battiati (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 40 days.

(21) Appl. No.: 09/583,458

(22) Filed: May 31, 2000

(30) Foreign Application Priority Data

May 31, 1999 (EP) .............................................. 99830334

(51) Int. Cl.[7] .................. H01L 21/8238; H01L 21/336; H01L 21/425
(52) U.S. Cl. ...................... 438/268; 438/212; 438/224; 438/228; 438/306; 438/526; 438/527
(58) Field of Search ................................. 438/212, 268, 438/224, 228, 301, 306, 519, 510, 527, 526

(56) References Cited

U.S. PATENT DOCUMENTS

| | | | |
|---|---|---|---|
| 4,587,713 A | | 5/1986 | Goodman et al. ......... 29/576 B |
| 4,774,198 A | | 9/1988 | Contiero et al. .............. 437/30 |
| 4,809,047 A | | 2/1989 | Temple ....................... 352/23.4 |
| 5,248,627 A | * | 9/1993 | Williams ............ 148/DIG. 126 |
| 5,923,979 A | * | 7/1999 | Pitzer et al. ................. 438/268 |
| 6,107,142 A | * | 8/2000 | Suvorov et al. ............. 438/138 |
| 6,153,473 A | * | 11/2000 | Calafut et al. .............. 438/133 |
| 6,221,719 B1 | * | 4/2001 | Franco ........................ 438/268 |

FOREIGN PATENT DOCUMENTS

EP           0889503           1/1999     ......... H01L/21/265

OTHER PUBLICATIONS

Sanqing et al., Design of Double Diffused Structure Power ICs, 1995, IEEE.*

Patent Abstract of Japan, Pub. No. 01132167, Pub. Date May 24, 1989, Applicant: Mitsubishi.

* cited by examiner

*Primary Examiner*—Vu A. Le
*Assistant Examiner*—Adam Pyonin
(74) *Attorney, Agent, or Firm*—Lisa K. Jorgenson; Allen, Dyer, Doppelt, Milbrath & Gilchrist, P.A.

(57) ABSTRACT

A process for forming a vertical double-diffused metal oxide semiconductor (VDMOS) structure comprising a semiconductor substrate, an epitaxial layer on the substrate, and a dielectric gate layer on the epitaxial layer includes implanting a first concentration dopant of a first conductivity type through an aperture defined by edges of a patterned gate conductor layer on the dielectric gate layer so that the first concentration dopant diffuses to form a body region of the VDMOS structure. A mask is formed on the patterned gate conductor layer and on a first portion of the body region for defining apertures exposing second portions of the body region. The process includes implanting through the apertures of the mask a dopant of a second conductivity type into the body region so that the dopant diffuses to define source regions therein, and implanting through the apertures of the mask a second concentration dopant of the first conductivity type so that the second concentration dopant is implanted at a depth below the source regions to form regions with a higher dopant concentration within the body region. The process further includes annealing to form source and body junctions above the higher dopant concentration regions within the body region.

29 Claims, 5 Drawing Sheets

FABRICATION OF VDMOS STRUCTURE WITH REDUCED PARASITIC EFFECTS

FIELD OF THE INVENTION

The present invention relates to field effect transistors, and, more particularly, to a vertical double-diffused metal oxide semiconductor (VDMOS) device.

BACKGROUND OF THE INVENTION

A VDMOS integrated structure includes source, body and drain regions of alternate type conductivity defined in a semiconductor electrically in series with each other. The body region is a diffused region that extends into the semiconductor while the source and drain regions are disposed near the surface of the semiconductor to define a certain length and width of a channel region in the body region. An insulated gate electrode is formed on the surface of the semiconductor, geometrically above the channel region.

In operation, by applying an appropriate voltage on the gate electrode, the type of conductivity of the diffused body region in the portion defined as the channel region, between the source and drain regions and directly underneath the gate electrode, is inverted. This forms a superficial channel in a depleted channel region.

The inverted channel allows a current flow between the source region formed inside the body region and the drain region of the device, which commonly surrounds the body region and which may be contacted on the bottom face of the semiconductor wafer. A typical VDMOS structure is described in U.S. Pat. No. 4,145,700.

The structure formed by the distinct regions of the source, body and drain of a VDMOS device in the semiconductor substrate determines the existence of either an NPN or PNP parasitic bipolar junction transistor. This depends on the respective types of conductivity of the regions of the VDMOS transistor structure.

The inevitable presence of this parasitic bipolar transistor structure is detrimental for important electrical characteristics of the VDMOS structure, and its effect must be minimized. Many ways have been proposed to reduce as much as possible the gain of such a parasitic bipolar transistor.

There are substantially two types of known techniques for reducing the gain of the parasitic bipolar transistor. A first approach short circuits the base and the emitter of the parasitic transistor with the metal that contacts and connects the source region of the VDMOS structure. A second and most commonly followed approach increases as much as possible the doping level of the base region of the parasitic transistor, represented by the body region of the VDMOS structure.

Although the latter approach is easy to implement in a normal manufacturing process for a VDMOS structure, it contrasts with the objective of maintaining a voltage threshold of the VDMOS between 1 and 5 volts. This imposes that the dopant concentration in the body region be kept between about $10^{16}$ and $10^{17}$ atoms/cm$^3$. This is definitely insufficient to effectively lower the gain of the parasitic bipolar transistor.

These contrasting requirements and incompatibilities are generally overcome by forming a body region which is not homogeneous, but is in the form of two layers or diffused regions formed independently from one another. A first zone of the body region establishes the concentration of dopant in the superficial channel region, and thereby the turn-on threshold voltage. The other zone of the body region has a relatively higher dopant concentration to provide for a base region of the parasitic transistor with a high dopant concentration to significantly reduce its gain.

These two zones of the body region with a different dopant concentration are made by two distinct dopant implants. For instance, a dose of about $10^{13}$ atoms/cm$^2$ is made for the implantation that determines the turn-on threshold voltage of the device. An increased implant dose of about $10^{15}$ atoms/cm$^2$ or greater is made to increase the dopant concentration in the zone that forms the base region of the parasitic transistor.

Commonly, this differentiation of the dopant level of the body region is made possible by either using two distinct masks, or by other additional processing steps. This increases the complexity of the fabrication process. FIGS. 1a to 1e schematically illustrate the basic steps of a prior art process for realizing a so-called deep body region having an increased dopant concentration to decrease the gain of the parasitic structure.

According to this known process, through a purposely reduced aperture of a mask M1 a first implantation is carried out. Mask M1 is typically formed by a patterned layer of silicon oxide with a thickness generally between 1 to 2 mm. In the considered example, the implanted dopant B is boron. The implant is generally made at 60 to 100 KeV, with a dose generally between $5*10^{14}$ and $5*10^{15}$ atoms/cm$^2$. This heavy implantation carried out through the relatively reduced mask aperture prevents a subsequent lateral diffusion of the implanted dopant, which may reach the channel region. This would increase the threshold voltage of the device.

A second body implantation is performed after having grown a gate oxide layer 3 on the n type epitaxial semiconductor grown over the n+ type semiconductor substrate. This is a reduced dose of boron implantation, generally between $10^{13}$ to $10^{14}$ atoms/cm$^2$, at 80 to 100 KeV. This implantation forms the superficial p-type body region in which the channel region of the structure is established. This ensures the desired turn-on threshold voltage of the device. This second shallower body implantation takes place through an aperture defined in a polysilicon layer 4 which will form the gate electrode of the device.

As shown in FIG. 1c, the dopant implant in the two distinct steps is diffused in the semiconductor, producing the characteristic profile of the body diffusion. Thereafter, the layer of the gate oxide is removed by masking and etching steps, and the n+ type source implant is carried out as depicted in FIG. 1d.

FIG. 1e shows the details of the structure after the deposition of an insulating dielectric layer 5, the opening of a via exposing the source contact zone, and the deposition of a metal layer 6. FIG. 1f shows the doping characteristic profile across a section of the epitaxial layer 2.

The set of FIGS. 2a–2g schematically shows another known prior art process that does not use the so-called deep body. This method includes realizing a buried body region (shallow body) having a high dopant concentration as described in U.S. Pat. No. 4,587,713.

According to this alternative technique, through the opening defined in the polysilicon layer 4, a first boron implantation of a moderate dose is carried out to ensure the desired turn-on threshold voltage of the device, as shown in FIG. 2a. This is followed by the dopant diffusion as depicted in FIG. 2b.

Thereafter, through a second photoresist mask R, a second boron implantation is performed at relatively high kinetic energies of about 150 to 500 keV, and in a dose sufficient to form a p+ type region with a relatively high doping level at a certain depth and within the p-type body diffusion already formed. The concentration peak of this p+ type region, often referred to as shallow body, should be located beneath the future source zone. This is realized by using an appropriate implantation energy. This step is schematically illustrated in FIG. 2c.

The fabrication process continues, similarly to the preceding case, with the masking and etching of the gate oxide layer 3 in the source zone, and with the n+ type source implant directly above the previously formed heavily doped p+ region (shallow body), as shown in FIG. 2d. FIG. 2e is a schematic cross section of the complete functional structure, and FIGS. 2f and 2g respectively show the doping characteristic profiles along a section crossing the source region and along a section not crossing the source region.

A second masking stage becomes necessary because if the high energy implant should be subjected to the annealing treatment of the body region, there would be a lateral diffusion of the dopant, and an expansion of the highly doped region reaching the region beneath the electrode 4. In other words, the expansion of the highly doped region reaches the channel region, which would undesirably alter the threshold voltage.

In order to eliminate the need for two distinct masking steps, the process described in U.S. Pat. No. 4,774,198, which is assigned to the current assignee of the present invention and which is incorporated herein by reference in its entirety, discloses the use of spacers on the patterned edges of the polysilicon. The '198 patent also discloses the implantation of the highly doped p+ type buried region through the restricted opening using the silicon oxide spacers. This is done while reducing the kinetic energy so that the implant is sufficiently shielded by the polysilicon layer. The shielding provided by a relatively thick masking resist layer does not exist in this case.

Thereafter, the fabrication process includes the elimination of the purposely formed spacers by a selective etching to open the source areas and the successive n+ type implant. This is done according to a normal fabrication sequence of operations.

Despite the advantage of eliminating the need for a second masking operation, the limitation of the kinetic energy of the implants that may be used without negatively affecting the electrical characteristics is an important drawback that is further accentuated by the scaling down of integrated devices. The electrical characteristics are negatively effected due to the passage of dopant through the masking gate electrode layer.

SUMMARY OF THE INVENTION

A fabrication method has now been found that eliminates the need for a second masking operation while permitting a high kinetic energy implant without particular constraints due to the relatively limited shielding capacity of an already patterned polysilicon gate layer. The implant is carried out through a resist mask having an adequate shielding capacity. Furthermore, the improved method of the invention also eliminates the need for additional operations, such as forming spacers of silicon oxide.

The method according to the present invention produces a substantial reduction in the complexity of the known processes, as well as a substantial elimination of the critical limits. The present invention also reduces the occasional insufficient shielding during a high energy implant of a dopant to form a highly doped buried shallow body region. The method according to the present invention offers a wide range of choices of implanting energies, and allows for a more precise positioning of the highly doped buried body region. This positioning may be inside a lightly doped body region previously formed with an appropriate dopant level to ensure the desired threshold voltage of the device.

The fabrication method of the invention comprises forming, after having formed the properly doped diffused body region, a resist mask that defines the implantation apertures of the source region. This is prior to the formation of the highly doped buried region inside the body region previously formed by implantation and diffusion of the dopant.

Through this resist mask, a dopant of the same conductivity type of the preformed body region is implanted at a sufficiently high kinetic energy. The implantation may extend down to a certain depth from the surface of the semiconductor substrate.

Another dopant of conductivity type opposite to the conductivity of the dopant used to realize the body region is implanted through the same mask. The implantation of this other dopant is performed at a lower kinetic energy than the one used to implant the dopant of the highly doped buried body region. This implantation forms source regions geometrically above the highly doped buried body regions, that is, in a superficial zone of the body region.

In view of the fact that the diffusion of the dopant implanted in the source region typically requires an annealing process at approximately 900–1000° C. for 10–20 minutes, or an RTA at 1100–1150° C. for 20–40 seconds, the coping profile of the superficial body zone remains practically unaltered and the threshold voltage is unmodified.

The resist mask shields those areas sensitive to high energy implantations through a masking step that is eliminated from the flow-sheet of a standard fabrication process. Additional steps are not necessary to form dielectric spacers along the defined aperture of the source area through the polysilicon gate layer, according to the known prior art process discussed above.

BRIEF DESCRIPTION OF THE DRAWINGS

The various aspects and advantages of the invention will be even clearer through the following description of an embodiment and by referring to the attached drawings, wherein.

DETAILED DESCRIPTION OF THE PREFERRED EMBODIMENTS

The ensuing description of an embodiment of the process of the Invention refers to the set of FIGS. 3a–3g, wherein the same parts are identified with the same numbers as used in the set of figures illustrating the known processes.

In the reported sample embodiment, a silicon wafer with a bulk resistivity of about 5–10 mΩcm and an n+ type conductivity is used. The n type epitaxial layer may have a thickness of about 5 mm when fabricating devices that must exhibit a breakdown voltage of around 100V, or of about 30 mm when fabricating devices that must exhibit a breakdown voltage of more than 500V. The bulk resistivity of the n type epitaxial layer may be respectively 2 Ωcm or about 20 Ωcm.

Salient steps of the process of the invention for fabricating an n-channel VDMOS structure, referred to as a p+ type shallow structure, are as in a standard process. A first p-type body implant is carried out through apertures in the polysilicon gate layer 4, already defined over the gate oxide layer 3. The gate oxide layer 3 may have a thickness ranging between 20 and 180 nm. The polysilicon gate layer 4 may have a thickness ranging between 300 and 700 nm.

Figure 1A:
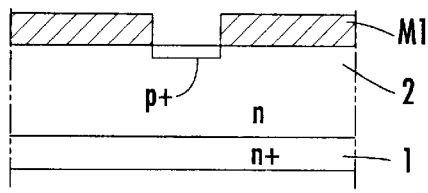
FIGS. 1a–1f and 2a–2a respectively illustrate an implantation process according to the prior art.
Figure 1B:
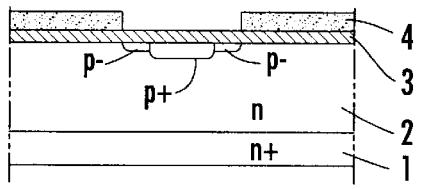
Figure 1C:
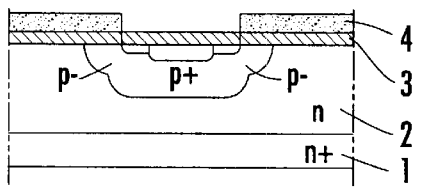
Figure 1D:
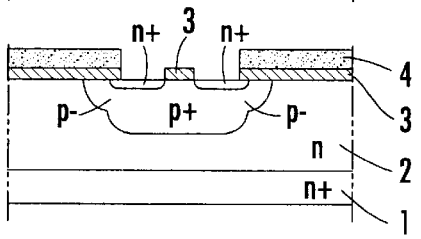
Figure 1E:
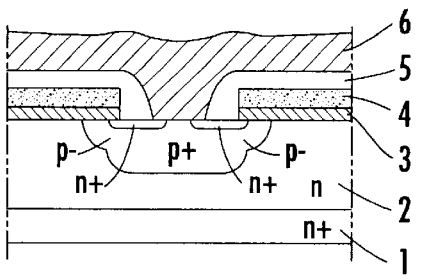
Figure 1F:
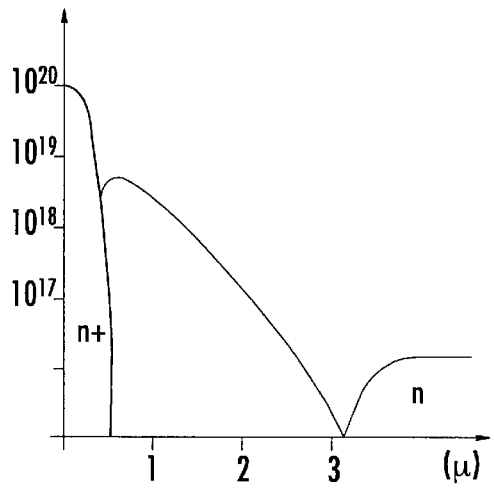
Figure 2A:
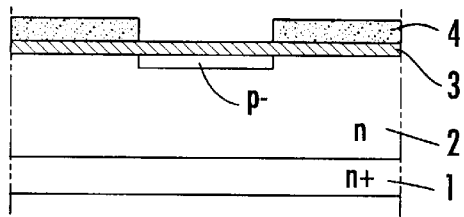
Figure 2B:
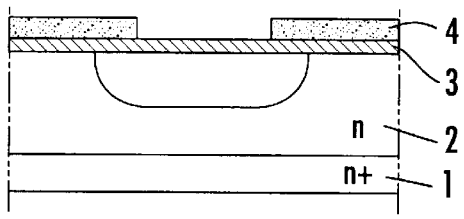
Figure 2C:
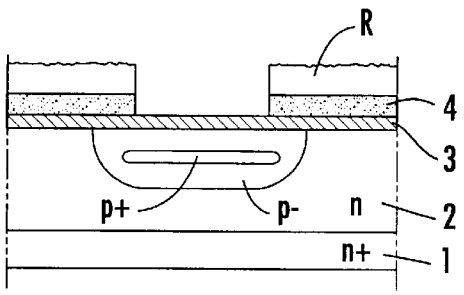
Figure 2D:
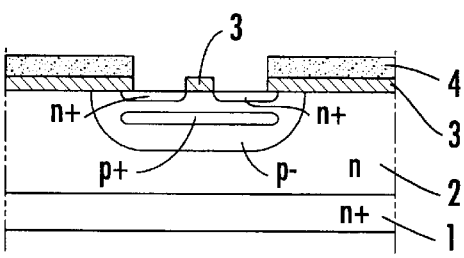
Figure 2E:
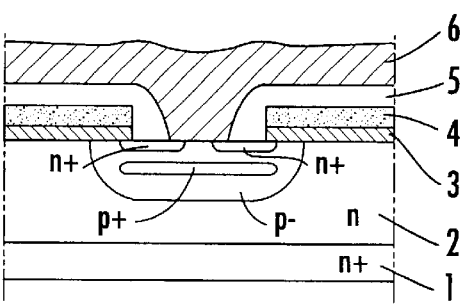
Figure 2F:
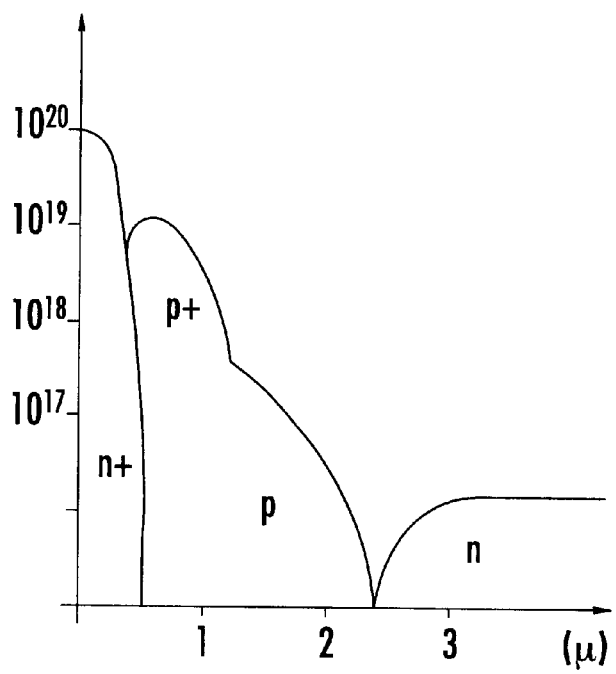
Figure 2G:
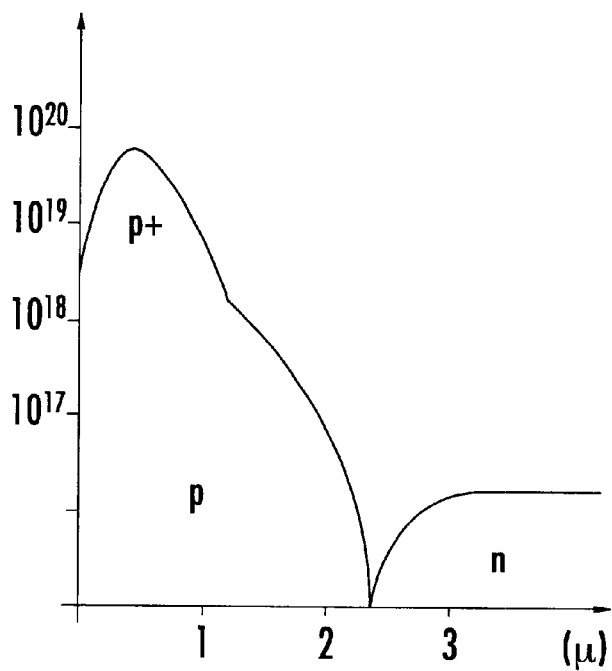
Figure 3A:
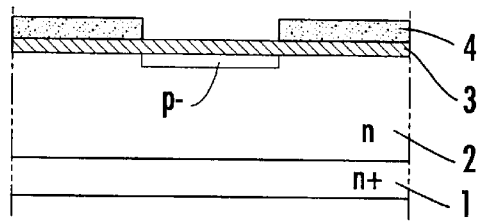
FIGS. 3a–3g illustrate an implantation process according to the present invention.
Figure 3B:
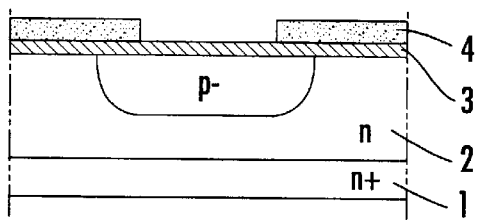

In the example considered, the body implant of boron is done with doses ranging from $10^{13}$ to $10^{14}$ atoms/cm$^2$, and with an implant having a kinetic energy that may vary between 80 and 100 KeV. After implantation, boron is diffused by annealing at a temperature of 900 to 1150° C. for a time of 1 to 4 hours, this produces a classical profile of the diffused region as depicted in FIG. 3b.

Figure 3C:
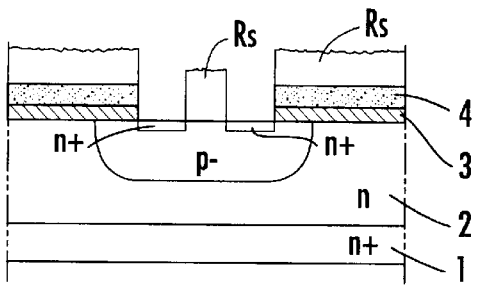

According to a fundamental aspect of the process of the invention, a resist Rs mask for the source implant as contemplated in a normal process is formed after the annealing. The n+ type source implant and the p+ type implant are carried out through the same resist mask Rs. Generally, the source implant, as depicted in FIG. 3c, is done with phosphorous or arsenic, in doses that may range between $10^{15}$ and $6*10^{15}$ atoms/cm$^2$, at a kinetic energy of 40 to 60 KeV. This is done to implant a superficial region of the silicon epitaxial layers at a depth of about 0.2–0.5 mm.

Boron is used for realizing the p+ type shallow structure and is implanted through the same Rs resist mask at a kinetic energy of 150 to 500 KeV, in doses of about $10^{14}$ to $10^{15}$ atoms/cm$^2$. Therefore, boron is implanted directly beneath the n+ type source implant.

Upon completing the two implants (n+ type source and p+ type shallow implants), a brief annealing treatment of source dopant diffusion is performed. Notably, this source annealing treatment has an extremely low thermal budget. The treatment may be carried out at 950° C. for about 15 minutes.

Alternatively, an RTA treatment may be implemented at 1100° C. for about 30 seconds. During this annealing treatment, the n+ type source/p-type body junctions are established.

Due to the limited conditions of the thermal budget, the doping profile of the superficial zone of the body region, that is, where the source junctions are formed, remains practically unaltered without the occurrence of any substantial variation of the threshold voltage. After removing the resist mask Rs and etching the oxide layer over the source areas, an insulating dielectric layer 5 is deposited according to the normal sequence of steps of a standard process. This is followed by the opening of the source contacts and the deposition of the metal layer 6.

Figure 3D:
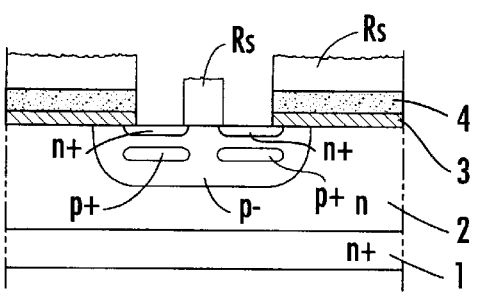
Figure 3E:
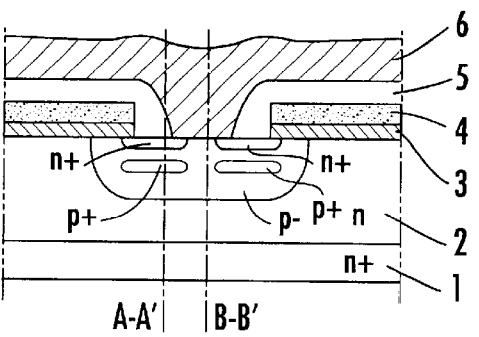
Figure 3F:
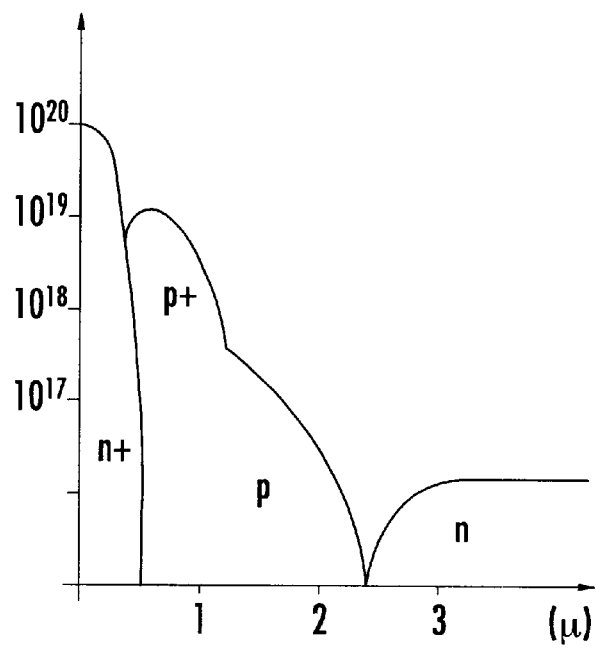
Figure 3G:
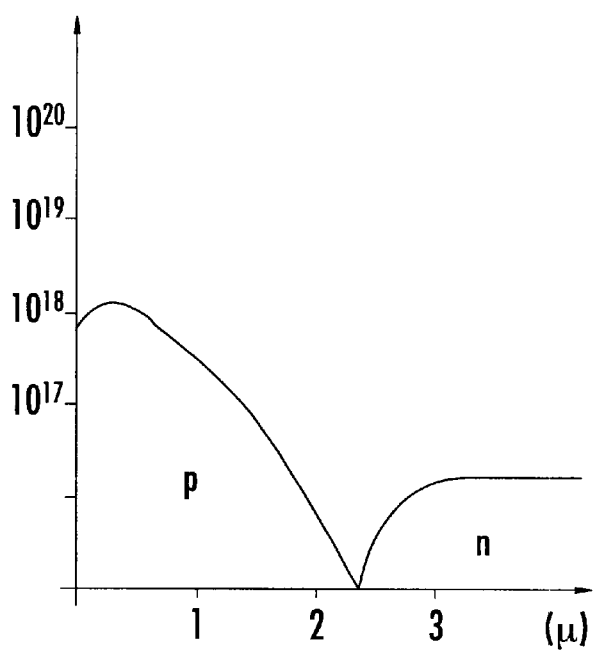

FIGS. 3f and 3d are dopant concentration diagrams relative to the cross sections A–A' and B–B', as identified in FIG. 3e.

The p+ type shallow structure of the invention effectively reduces the gain of the parasitic bipolar junction transistor of the VDMOS transistor structure, while eliminating a masking step with evident advantages. These results are achieved while averting any degradation of the electrical properties of the gate dielectric because the resist mask ensures an effective shielding of sensitive areas during the high energy implantation.

That which is claimed is:

1. A method for forming a vertical double-diffused metal oxide semiconductor (VDMOS) structure comprising a semiconductor substrate, an epitaxial layer on the substrate, and a dielectric gate layer on the epitaxial layer, the method comprising:

implanting a first concentration of a first conductivity type dopant through an aperture defined by edges of a patterned gate conductor layer on the dielectric gate layer to form a body region of the VDMOS structure;

forming a mask on the patterned gate conductor layer and on a first portion of the body region for defining apertures exposing second portions of the body region;

implanting through the apertures of the mask a second conductivity type dopant into the body region to define source regions in a superficial zone;

implanting through the apertures of the mask a second concentration of the first conductivity type dopant at a depth below the superficial zone to form regions with a higher dopant concentration within the body region; and annealing to form source and body junctions above the higher dopant concentration regions within the body region.

2. A method according to claim 1, wherein the first conductivity type comprises p-type conductivity, and the second conductivity type comprises n-type conductivity so that the VDMOS structure comprises a channel between the source regions having the n-type conductivity.

3. A method according to claim 1, wherein the epitaxial layer comprises a bulk resistivity in a range of about 2 to 20 Ωcm.

4. A method according to claim 1, wherein the first conductivity type dopant comprises boron; and wherein implanting the first concentration of the first conductivity type dopant is performed at an energy between about 60 and 100 keV at a dose of between about $10^{13}$ and $10^{14}$ atoms/cm$^2$.

5. A method according to claim 1, wherein the second conductivity type dopant comprises phosphorous; and wherein implanting the second conductivity type dopant is performed at an energy between about 40 and 60 keV at a dose of between about $10^{14}$ and $6*10^{15}$ atoms/cm$^2$.

6. A method according to claim 1, wherein the first conductivity type dopant comprises boron; and wherein implanting the second concentration of the first conductivity type dopant is performed at an energy between about 150 and 500 keV at a dose of between about $10^{14}$ and $10^{15}$ atoms/cm$^2$.

7. A method according to claim 1, wherein the annealing is performed at a temperature between about 900 and 1000° C. for a time between about 10 and 20 minutes.

8. A method according to claim 1, wherein the annealing is performed at a temperature of about 1100° C. to 1200° C. for a time between about 20 to 40 seconds.

9. A method for forming a vertical double-diffused metal oxide semiconductor (VDMOS) structure comprising:

forming a mask on a body region of a first concentration of a first conductivity type in a layer of a second conductivity type;

implanting through the apertures of the mask a second conductivity type dopant into the body region to define source regions therein; and implanting through the apertures of the mask a second concentration of the first conductivity type dopant at a depth below the source regions to form regions with a higher dopant concentration within the body region.

10. A method according to claim 9, further comprising annealing to form source and body junctions above the higher dopant concentration regions within the body region.

11. A method according to claim 9, further comprising implanting a first concentration of the first conductivity type dopant into the layer of the second conductivity type to form the body region of the VDMOS structure.

12. A method according to claim 9, wherein the layer of the second conductivity type comprises an epitaxial layer.

13. A method according to claim 9, wherein the first conductivity type comprises p-type conductivity, and the second conductivity type comprises n-type conductivity so that the VDMOS structure comprises a channel between the source regions having the n-type conductivity.

14. A method according to claim 9, wherein the layer of the second conductivity type comprises a bulk resistivity in a range of about 2 to 20 Ωcm.

15. A method according to claim 11, wherein the first conductivity type dopant comprises boron; and wherein implanting the first concentration of the first conductivity type dopant is performed at an energy between about 60 and 100 keV at a dose of between about $10^{13}$ and $10^{14}$ atoms/cm$^2$.

16. A method according to claim 9, wherein the second conductivity type dopant comprises phosphorous; and wherein implanting the second conductivity type dopant is performed at an energy between about 40 and 60 keV at a dose of between about $10^{14}$ and $6*10^{15}$ atoms/cm$^2$.

17. A method according to claim 9, wherein the first conductivity type dopant comprises boron; and wherein implanting the second concentration of the first conductivity type dopant is performed at an energy between about 150 and 500 keV at a dose of between about $10^{14}$ and $10^{15}$ atoms/cm$^2$.

18. A method according to claim 9, wherein the annealing is performed at a temperature between about 900 and 1000° C. for a time between about 10 and 20 minutes.

19. A method according to claim 9, wherein the annealing is performed at a temperature of about 1100° C. to 1200° C. for a time between about 20 to 40 seconds.

20. A method for forming a vertical double-diffused metal oxide semiconductor (VDMOS) structure comprising:

forming a mask on a body region of a first concentration of a p-type conductivity in a layer of an n-type conductivity;

implanting through the apertures of the mask an n-type conductivity dopant into the body region at an energy between about 40 and 60 keV at a dose between about $10^{14}$ and $6*10^{15}$ atoms/cm$^2$ to define source regions therein;

implanting through the apertures of the mask a second concentration dopant of the p-type conductivity at an energy between about 150 and 500 keV at a dose between about $10^{14}$ and $10^{15}$ atoms/cm$^2$ so that the dopant is implanted at a depth below the source regions to form regions with a higher dopant concentration within the body region.

21. A method according to claim 20, further comprising implanting a first concentration dopant of the p-type conductivity into the layer of the n-type conductivity at an energy between about 60 and 100 keV at a dose between about $10^{13}$ and $10^{14}$ atoms/cm$^2$ to form a body region of the VDMOS structure.

22. A method according to claim 20, further comprising annealing to form source and body junctions above the higher dopant concentration regions within the body region.

23. A method according to claim 20, wherein the layer of the n-type conductivity comprises an epitaxial layer.

24. A method according to claim 20, wherein the layer of the n-type conductivity comprises a bulk resistivity in a range of about 2 to 20 Ωcm.

25. A method according to claim 21, wherein the first concentration dopant comprises boron.

26. A method according to claim 20, wherein the n-type conductivity dopant comprises phosphorous.

27. A method according to claim 20, wherein the second concentration dopant comprises boron.

28. A method according to claim 20, wherein the annealing is performed at a temperature between about 900 and 1000° C. for a time between about 10 and 20 minutes.

29. A method according to claim 20, wherein the annealing is performed at a temperature of about 1100° C. to 1200° C. for a time between about 20 to 40 seconds.

* * * * *